(12) United States Patent
Guzik et al.

(10) Patent No.: US 9,842,981 B1
(45) Date of Patent: Dec. 12, 2017

(54) HERMETICALLY SEALED PIEZOELECTRIC ACTUATOR ASSEMBLY

(71) Applicant: Guzik Technical Enterprises, Mountain View, CA (US)

(72) Inventors: Nahum Guzik, Palo Alto, CA (US); Wei Zhuang, San Francisco, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 15/361,807

(22) Filed: Nov. 28, 2016

(51) Int. Cl.
*H01L 41/053* (2006.01)
*H01L 41/09* (2006.01)
*H01L 41/047* (2006.01)

(52) U.S. Cl.
CPC ...... *H01L 41/0533* (2013.01); *H01L 41/0475* (2013.01); *H01L 41/09* (2013.01)

(58) Field of Classification Search
CPC .. H01L 41/0533; H01L 41/0475; H01L 41/09
USPC ........................................ 310/344, 348, 366
See application file for complete search history.

(56) References Cited

U.S. PATENT DOCUMENTS

| 4,803,393 A | 2/1989 | Takahashi |
| 5,113,108 A | 5/1992 | Yamashita et al. |
| 6,006,614 A | 12/1999 | Guzik et al. |
| 7,665,445 B2 | 2/2010 | Venkataraghavan et al. |
| 8,193,686 B2 | 6/2012 | Cooke |

FOREIGN PATENT DOCUMENTS

GB              2355528 A    *  4/2001    ............... G01V 1/52

* cited by examiner

*Primary Examiner* — Thomas Dougherty
(74) *Attorney, Agent, or Firm* — Burns & Levinson LLP; Joseph M. Maraia

(57) ABSTRACT

A piezoelectric actuator includes a housing body and lid wherein the housing body defines an open-ended cylindrical interior chamber extending along a displacement axis. The lid bolts to the body transverse to the open end allowing easy access to an electrostrictive assembly disposed within the chamber. The electrostrictive assembly includes an electrostrictive element affixed at one end to the housing by a cup element with an outermost cylindrical surface, and at an opposite, and free, end, to a driver having a portion with a outermost cylindrical surface. The outermost cylindrical surfaces both include circumferential sealing elements, for example, circumferential grooves in which resilient a sealing O-ring resides, or circumferential wiper seals. The assembly is dimensioned to fit wholly within the chamber, with the circumferential sealing elements establishing a hermetic seal while allowing sliding motion of the free end of the electrostrictive element, and the driver, along the displacement axis.

14 Claims, 4 Drawing Sheets

HERMETICALLY SEALED PIEZOELECTRIC ACTUATOR ASSEMBLY

FIELD OF THE INVENTION

The present invention relates to protection of the piezoelectric actuators from the impact of the environment, and in particular to encapsulated piezoelectric actuators.

BACKGROUND OF THE INVENTION

Piezoelectric actuators are used extensively in communications equipment, in high precision measurement devices, and in many other areas. In particular, they are often used in magnetic head and disk testers (see, for example, U.S. Pat. No. 6,006,614) for data storage devices.

Conventional piezoelectric actuators for those applications typically include an electrostrictive element disposed between electrically conductive drive electrodes, all within an electrically insulating envelope, or shell. Often conventional piezoelectric actuators include a lead carbonate titanate (PZT) material disposed adjacent to insulating lead oxide in grain boundaries of the lead carbonate titanate material.

It is well known that piezoelectric actuators are sensitive to a significant extent to external agents. The presence of environmental moisture, for example, is known to cause electrochemical ion migration on the surface of the electrostrictive element of an actuator, leading to a deterioration or corrosion of insulation characteristics within the actuator. This moisture-based phenomenon is exacerbated by contamination by electrically conductive materials. In actuators including lead carbonate titanate (PZT) material, the same result often occurs due to reduction of the insulating lead oxide in the grain boundaries of the lead carbonate titanate (PZT) material. Such corrosion of piezoelectric actuator components are known to affect dynamic features of the actuator.

The practice of working with magnetic head and disk testers shows that the impact of the environment on piezoelectric actuators is often responsible for significant deterioration of operational parameters of such testers over time, and in particular in relation to the precision of head positioning with respect to a disk under test.

It is known in the art, to protect a piezoelectric actuator from certain aspects of ambient surroundings using hermetic encapsulation. A number of methods for so protecting piezoelectric actuators by encapsulation have been proposed in U.S. Pat. No. 4,803,393, U.S. Pat. No. 5,113,108, U.S. Pat. No. 7,665,445, U.S. Pat. No. 8,193,686, and others. In essence, those proposals are different embodiments of one basic approach depicted in FIG. 1.

In FIG. 1, an encapsulated piezoelectric actuator 100 principally comprises an electrostrictive element 101 and an elongated envelope 102. The elongated envelope 102 includes a correspondingly elongated inward-facing wall extending about and along a central displacement axis CDA, defining a correspondingly elongated interior chamber. The interior chamber extends from a proximal end P of envelope 102 to a distal end D of envelope 102. As illustrated, envelope 102 is an elongated (in the direction of axis CDA) corrugated structure, having periodic variations in radius along the axis CDA.

A proximal end element 103 spans the proximal end P of envelope 102, sealed at its periphery to the inward-facing wall of envelope 102, for example, by welding. A plate 104 spans the distal end D of envelope 102, sealed at its periphery to the inward-facing wall of envelope 102, for example, by welding. Together, the weld junctions of both proximal end element 103 at the proximal end P of envelope 102, and plate 104 at the distal end D of envelope 102, with the inward-facing wall of envelope 102, establish the interior chamber as hermetically sealed.

The electrostrictive element 101 is disposed within the interior chamber, extending about and along axis CDA, from proximal end P of envelope 102 to distal end D of envelope 102. Lateral surfaces of the electrostrictive element 101 are spaced apart from the inward-facing wall of envelope 102. Electrostrictive element 101, at its proximal end, is affixed to an inward-facing surface of proximal end element 103, and, at its distal end, is affixed to an inward-facing surface of plate 104.

Two electrical leads 105 pass through glass seals in the proximal end element 103. Within the interior chamber, distal ends of leads 105 are connected to a pair of electrically conductive elements 106 extending along opposite lateral surfaces of electrostrictive element 101. A hermetically sealable gas inlet 107 passes through the proximal end element 103. That inlet is used to selectively evacuate air from the envelope 102 and/or to fill it with a gas as desired.

As noted, the envelope 102 is an elongated (in the direction of axis CDA) corrugated structure, including exemplary corrugation 108, so that the inward-facing wall of envelope 102 has variations in radius in along the axis CDA. The corrugated structure establishes, in effect, a series of extendible (in the direction of axis CDA) flexures, enabling envelope 102 to expand or contract in length in a direction along the central displacement axis CDA of the piezoelectric actuator, tracking expansion and contraction of the electrostrictive element 101 along axis CDA, without breaking the gas-tightness of the envelope 102.

While the structure of the prior art actuator of FIG. 1 can, to a point, generally perform certain of the desired functions needed in magnetic head and disk testers for example, there are important limitations of such structures. For example, hermetic sealing of proximal end element 104 to the envelope 102 requires welding, or a similar difficult to perform and costly operation, of the periphery of proximal end element 103, and plate 104, to envelope 102. Further, maintenance of such actuators in an operational setting, typically requires periodic replacement of the electrostrictive element 101. With the structure of FIG. 1, opening of the hermetically sealed interior chamber of envelope 102 (typically sealed by welding or the like) is required, with a following re-sealing (typically re-sealed by re-welding or the like). In view of these difficulties and shortcomings of the prior art, improved encapsulated piezoelectric actuators are needed.

DETAILED DESCRIPTION

An improved encapsulated piezoelectric actuator structure, or assembly, is described below which resolves the above described shortcomings of prior art sealed actuators.

Figure 1:
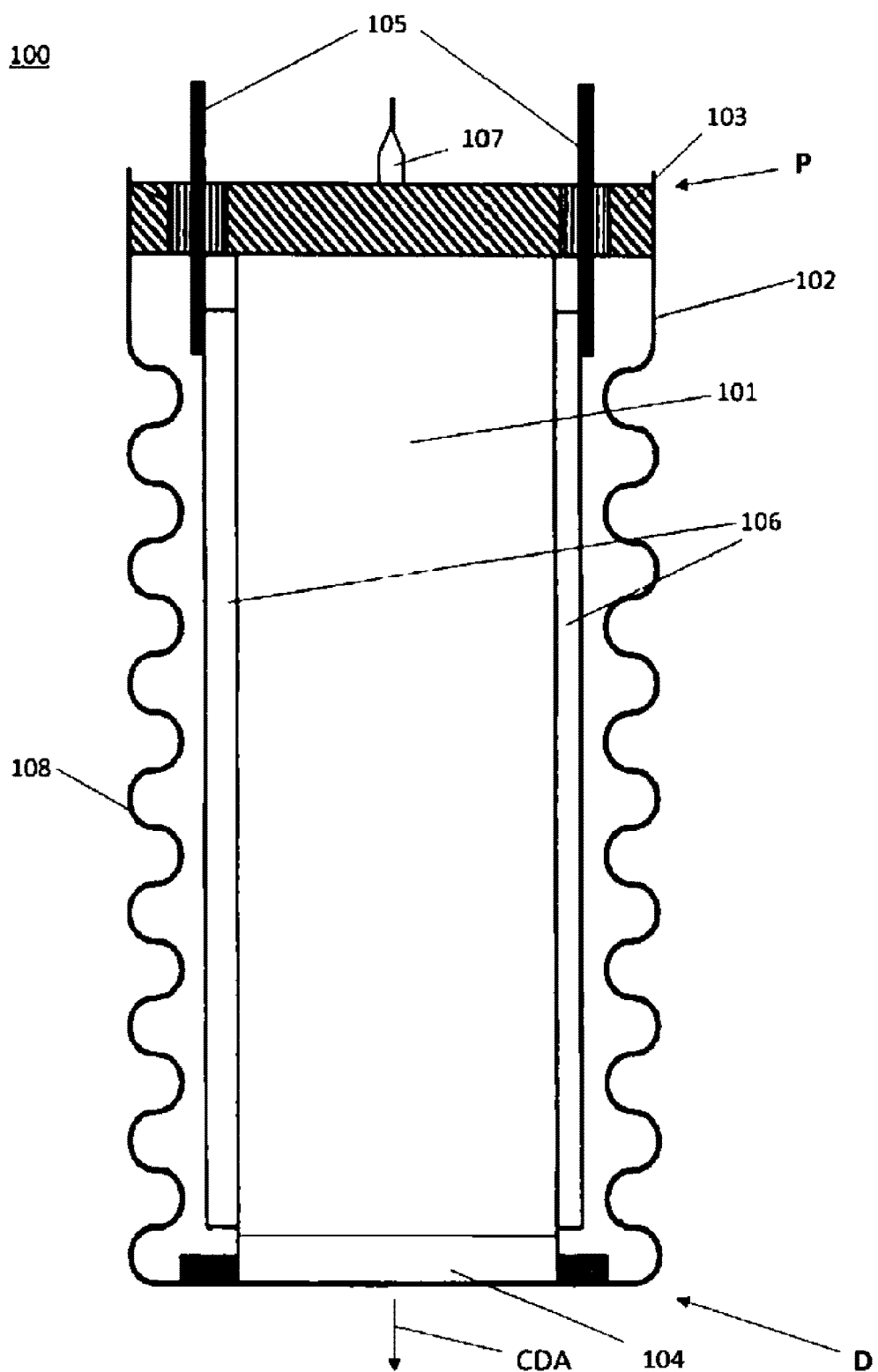
FIG. 1 shows a basic structure representative of prior art encapsulated piezoelectric actuators.
Figure 2:
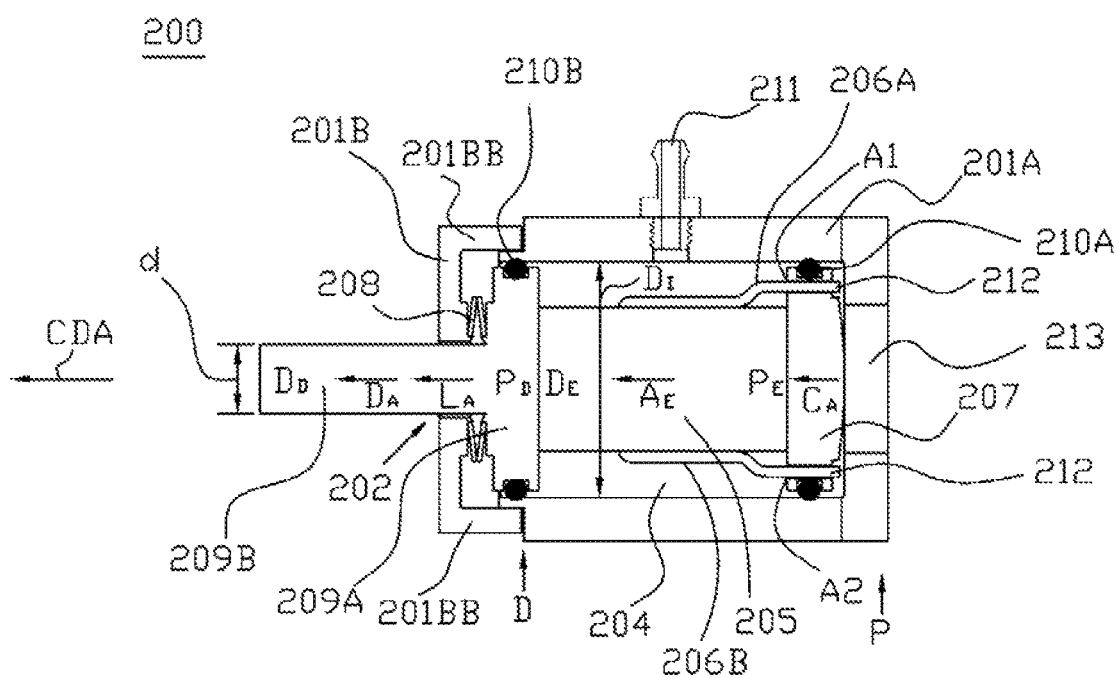
FIG. 2 shows a side cross-sectional view of an exemplary piezoelectric actuator according to the present invention.
Figure 3:
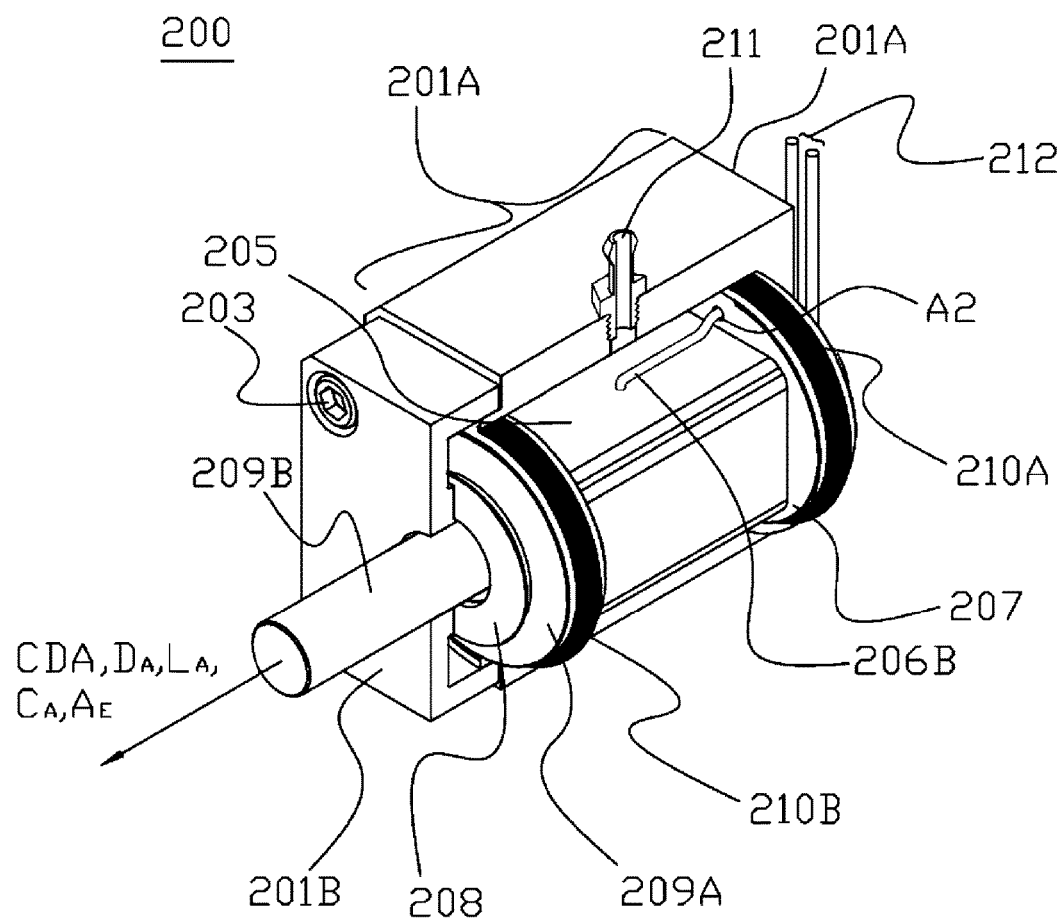
FIG. 3 shows a perspective, exploded view of the exemplary piezoelectric actuator of FIG. 2.
Figure 4:
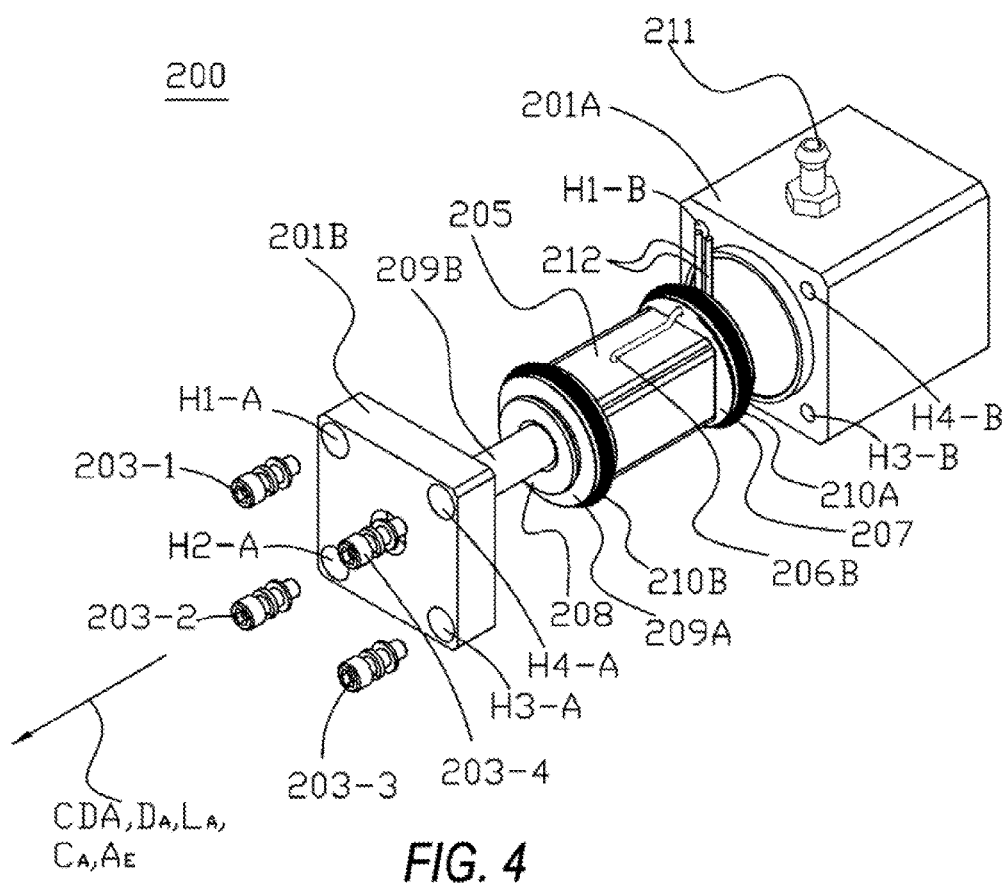
FIG. 4 shows an assembly drawing of the exemplary piezoelectric actuator of FIG. 2.

That improved encapsulated piezoelectric actuator structure provides a novel and simple, low in cost, and easily constructed and maintained, encapsulated piezoelectric actuator. An exemplary piezoelectric actuator assembly 200 according to the present invention is shown in FIGS. 2-4. More particularly, FIG. 2 shows a side cross-sectional view of piezoelectric actuator assembly 200. FIG. 3 shows a perspective, exploded view of piezoelectric actuator assembly 200. FIG. 4 shows an assembly sketch of piezoelectric actuator assembly 200.

The piezoelectric actuator assembly 200 comprises a two-part housing 201 having a generally cup-shaped housing body 201A and a housing lid 201B. In the illustrated embodiment of FIGS. 2-4, housing body 201A includes an inward-facing cylindrical wall extending about and along a central displacement axis CDA, defining an open-ended cylindrical interior chamber 204, with diameter D1, extending along and about central displacement axis CDA from a closed proximal end P to an open distal end D. Cylindrical interior chamber 204 is spanned at proximal end P, by a rigid base wall 213 transverse to central displacement axis CDA.

Housing body 201A has a substantially rectangular parallelpiped outer shape, with a planar portion of the outer shape allowing simplified (compared to the prior art) connection to a support platform, for example, for a magnetic head and disk tester. Other outer shapes can be employed in other embodiments, including, for example, a half-cylinder having a side surface with a semi-cylinder outer surface portion and a planar outer surface portion. Preferably, there is at least one planar portion to permit easy attachment to a planar support surface in an operational configuration. The term "substantially rectangular parallelpiped outer shape" means that the envelope of the housing body is a rectangular parallelpiped, but where various regions of the outer surface may be inwardly directed but out of the plane of the surfaces of the parallelpiped envelope.

In the illustrated embodiment, housing lid 201B is adapted to interfit with distal end D of housing body 201A, and attach to housing body 201A, generally spanning the open end of cylindrical interior chamber 204 of housing body 201A. In the illustrated embodiment, but not all forms, housing lid 201B has a rectangular cross-section cup-like shape with a square planar base disposed about a lid axis LA, and hollow square cross-section shell or rim 201BB extending perpendicularly therefrom. An inner surface of rim 201BB is adapted to interfit with distal end D of housing body 201A, with lid axis LA aligned with central displacement axis CDA. The square planar base of includes four lid attachment through holes H1-A, H2-A, H3-A, H4-A at its respective four corners, and extending along respective lid attachment axes in the direction of lid axis LA.

In the illustrated embodiment, housing lid 201B (FIG. 4) is affixed to housing body 201A by way of four bolts 203-1, 203-2, 203-3, 203-4 extending through attachment through holes H1-A, H2-A, H3-A, H4-A in housing lid 201B and into four associated threaded boreholes H1-B, H2-B, H3-B, H4-B extending into housing body 201A along bolt attachment axes parallel to axis CDA. Housing lid 201B includes a central aperture 202 disposed about lid axis LA, which is aligned with axis CDA when housing lid 201B is affixed to housing body 201A by the respective bolts. Preferably, but not necessarily, aperture 202 is circular with a radius R about lid axis LA. Aperture 202 may, for example, be defined by contour points other that circular but where each such point is displaced from axis LA by a distance greater than or equal to R.

An electrostrictive element 205 extending along an electrostrictive axis $A_E$ from a proximal end $P_E$ to a distal end $D_E$, is disposed within cylindrical interior chamber 204. The electrostrictive element 205 is supported at proximal end $P_E$ by a rigid cylindrical cup element 207, and, at a distal end $D_E$, by a driver element 209. In the illustrated embodiment, electrostrictive element 205 is a rectangular parallelpiped, elongated in the direction of electrostrictive axis $A_E$.

Cylindrical cup element is cup-shaped about a central cup axis CA, with an open end facing and facing and adjacent to the proximal end $P_E$ of electrostrictive element 205, and a closed end facing and adjacent to base wall 213 of housing body 201A. Cylindrical cup element 207 includes a cylindrical lateral surface having a circumferential groove in which a resilient, sealing O-ring 210A is disposed. The diameter of the cylindrical lateral surface of cylindrical cup element 207 is less than the diameter of the cylindrical interior chamber 204. In the illustrated embodiment, cup element 207 includes an interior void region extending from one end, into which the distal end $P_E$ of electrostrictive element 205 extends. In other embodiments, the cup element can have a "zero" depth interior void region, or even a raised, or negative depth, "void region", to which the distal end $P_E$ of electrostrictive element 205 is attached. Cup element 207 protects the proximal end $P_E$ of electrostrictive element 205 from strokes against base wall 213 of housing 201.

Driver element 209 includes a cylindrical disk portion 209A and a cylindrical drive shaft or rod 209B, both extending along and about a driver axis DA from a proximal end $P_D$ facing and adjacent to the distal end $D_E$ of electrostrictive element 205 to a distal end $D_D$ opposite to proximal end $P_D$, and wherein cylindrical drive shaft 209B has a diameter less than R. Cylindrical disk portion 209A includes a cylindrical lateral surface having a circumferential groove in which a resilient, sealing O-ring 210B is disposed. The diameter of the cylindrical lateral surface of disk portion 209A is less than the diameter of cylindrical interior chamber 204. The driver element 209 is preloaded relative to the electrostrictive element 205 and housing 201, by spring washers 208 which are disposed between the cylindrical disk portion 209A of the driver element 209 and the housing lid 201B of housing 201. The cylindrical disk portion 209A of driver element 209 is rigidly coupled to the distal end $D_E$ of electrostrictive element 205 (for example, by epoxy glue), while the distal end $D_D$ of the driver shaft 209B is adapted for coupling to a load to be moved (not shown).

The assembly of cylindrical cup element 207 with sealing O-ring 210A, and cylindrical disk portion 209A of driver element 209 with sealing O-ring 210B, together with electrostrictive element 205, have dimensions, and respective resiliency coefficients of sealing O-rings 210A and 210B, so that the assembly between sealing O-rings 210A and 210B fits wholly within cylindrical interior chamber 204 during operation of actuator 200, with O-rings 210A and 210B centering electrostrictive element 205 about axis CDA and permitting sliding expansion/contraction motion of distal end $P_E$ of electrostrictive element 205 of the assembly with respect to housing body 201A in the direction of axis CDA, while hermetically sealing cylindrical interior chamber 204 between O-rings 210A and 210B with respect to points outside of that portion of cylindrical interior chamber 204

In other forms of the piezoelectric actuator, different sealing elements may be used. For example, the O-ring seals are replaced by circumferentially extending wiper seals.

Electrical lead wires 206A and 206B extend from respective opposite lateral surfaces of the electrostrictive element 205, and penetrate through an associated one of two hermetically sealed apertures A1, A2, to points outside of the housing 201, forming electrical terminals 212. In other forms of the piezoelectric actuator, different electrical drive configurations can be used for the electrostrictive element.

The housing 201 further includes an inlet/valve 211 that provides pneumatic access to the cylindrical interior chamber 204, enabling the evacuation (or injection) of air or other gas from (or into) the cylindrical interior chamber 204 of the housing 201 as desired. Such other gas can be an inert gas, such as nitrogen, for example. The use of an inert gas reduces or entirely prevents corrosion of the surface of the interior chamber 204, which might otherwise disrupt the normal relative movement of the O-rings 210 inside the cylindrical interior chamber 204.

In operation, the circumferential grooves in the lateral surface of cup element 207 and the lateral surface of driver disk portion 209B, respectively support O-rings 210A and 210B, and together with the cylindrical wall defining chamber 204, effect a pneumatic actuator providing both hermetically sealing to the portion of cylindrical interior chamber 204 between O-rings 210A and 210B, and centering of the rectangular cross-section electrostrictive element 205 inside cylindrical interior chamber 204. In that way, lid axis LA, electrostrictive axis $P_E$, driver axis DA and cup axis CA are all aligned with central displacement axis CDA, and sliding movement of the driver 209 along the longitudinal central displacement axis CDA of the cylindrical interior chamber 204 of the housing 201, without breach of the chamber hermetic nature, is enabled.

In response to a drive signal applied across terminals 212, the length of electrostrictive element 205 (in the direction of axis CDA) varies. Since the proximal end of electrostrictive element 205 is affixed to cup element 207, which in turn is rigidly coupled to base wall 213 of housing 201, the opposite, and free, distal end $P_D$ of electrostrictive element 205 is displaced in the direction of axis CDA, resulting in a corresponding displacement of driver element 209. Under most operational circumstances, the drive signal is used to selectively displace the distal end $P_D$ of electrstrictive element 205, and thereby drive shaft 209B, away from cup element 207, and proximal end P of housing body 201A. The distal end $D_D$ of drive shaft 209B becomes an end effector, imparting its drive signal-caused displacement to an external load. Upon removal of a drive signal across terminals 212, return movement of drive shaft or rod 209B in the opposite direction, and toward cup element 207, is forced by the spring washers 208.

As may be seen from the description above, the above-described structure established a low cost encapsulated piezoelectric actuator assembly in which an interior piezoelectric driver can be readily accessed for repair, replacement or maintenance, by merely disassembling a bolted-together housing. Moreover, an improved electrostrictive driver structure is provided by the novel slide/hermetic sealing structure. Costs associated with both the initial construction, as well as maintenance, is low compared with prior art encapsulated piezoelectric actuators largely because of the elimination of a requirement for assembly using costly and difficult to perform techniques such as welding.

Although the foregoing description of the embodiment of the present invention contains some details for purposes of clarity of understanding, the invention is not limited to the detail provided. There are many alternative ways of implementing the invention. The disclosed embodiments are illustrative and not restrictive.

What is claimed is:

1. A piezoelectric actuator comprising:
   A. a housing including a housing body and a housing lid, wherein the housing body defines an open-ended cylindrical interior chamber extending along a displacement axis and having a diameter D1, and a housing lid bolted transverse to the open end,
   B. an electrostrictive assembly including:
      i. an electrostrictive element extending between proximal and distal ends thereof along a electrostrictive axis,
      ii. a cap element having a cylindrical outermost surface having a diameter less than D1 and being affixed to the proximal end of the electrostrictive element transverse to the electrostrictive axis,
      iii. a driver element having a cylindrical outermost surface having a diameter less than D1, and bearing a circumferential groove therein, and at one end being rigidly connected to the distal end of the electrostrictive element transverse to the electrostrictive axis, and at an opposite end, being adapted for coupling to an exterior load,
      iv. a first sealing element extending circumferentially about the cylindrical outermost surface of the cap element, and
      v. a second sealing element extending circumferentially about the cylindrical outermost surface of the driver element,
      wherein the electrostrictive assembly, including the cap element with the first sealing element, and the driver element with the second sealing element, together with electrostrictive element, have dimensions, and respective resiliency coefficients of the first and second sealing elements, so that the electrostrictive assembly between the first sealing element and the second sealing element fits wholly within the cylindrical interior chamber with the electrostrictive axis aligned with the displacement axis during operation of the actuator, with the sealing elements permitting sliding expansion/contraction motion of the distal end $P_E$ of the electrostrictive element of the electrostrictive assembly with respect to the housing in the direction of the displacement axis, while hermetically sealing the cylindrical interior chamber between the first and second sealing elements with respect to points outside of that portion of cylindrical interior chamber.

2. The piezoelectric actuator of claim 1, further comprising an inlet configured to allow selective removal air from the interior chamber and addition of an inert gas to the interior chamber.

3. The piezoelectric actuator of claim 2, wherein the inert gas is nitrogen.

4. The piezoelectric actuator of claim 1, further comprising at least one spring washer disposed between the driver and the housing lid, said washers being configured to preload the driver relative to the electrostrictive element, thereby providing a return force to the driver following displacement.

5. The piezoelectric actuator of claim 1, wherein:
   the first sealing element is a first O-ring disposed in a groove extending into and circumferentially about the cylindrical outermost surface of the cap element, and the second sealing element is a second O-ring disposed in a groove extending into and circumferentially about the cylindrical outermost surface of the driver element.

6. The piezoelectric actuator of claim 1, wherein:
the first sealing element is a first wiper seal attached to and extending circumferentially about the cylindrical outermost surface of the cap element, and
the second sealing element is a second wiper seal attached to and extending circumferentially about the cylindrical outermost surface of the driver element.

7. A piezoelectric actuator, comprising:
A. a housing including:
  i. a cup-shaped housing body including:
    a. an inward-facing cylindrical wall extending about and along central displacement axis CDA, wherein:
      (1) the inward-facing wall defines an open-ended cylindrical interior chamber having diameter D1 and extending along and about central displacement axis CDA from a closed proximal end P to an open distal end D, and
      (2) the proximal end P is spanned by a base wall transverse to central displacement axis CDA,
  ii. a housing lid extending about a lid axis LA, and including an aperture passing therethrough about the lid axis LA, wherein:
    a. the aperture is characterized by a boundary greater than or equal to R from the lid axis LA, and
    b. the housing lid is adapted to interfit with, reversibly attach to, and span the distal open end D of the housing body, whereby the lid axis LA is aligned with the central displacement axis CDA,
  iii. an attachment assembly for securing the housing lid to the housing body with the lid axis LA aligned with the central displacement axis and the housing lid interfitting with the housing body,
B. an electrostrictive assembly including:
  i. an electrostrictive element extending along an electrostrictive axis $A_E$ from a proximal end $P_E$ to a distal end $D_E$, and wherein the electrostrictive element includes electrically conductive elements disposed on opposite lateral surfaces thereof between the proximal end $P_E$ to a distal end $D_E$,
  ii. a cylindrical cup element extending along and about a cup axis CA from a closed proximal end to an open distal end, and having:
    a. a cylindrical lateral surface disposed about the cup axis CA, wherein the diameter of the cylindrical lateral surface is less than the diameter of the diameter D1 of the cylindrical interior chamber,
    b. a first sealing element extending circumferentially about the lateral surface of the cup element, and wherein the proximal end of the electrostrictive element is affixed to the cup element with the open distal end of the cup element facing the proximal end PE of the electrostrictive element, and so that the cup axis CA is aligned with the electrostrictive axis $A_E$,
  iii. a driver element including a cylindrical disk portion and a cylindrical drive shaft, both extending along a driver axis DA from a proximal end $P_D$ to a distal end $D_D$ opposite to proximal end $P_D$, and wherein cylindrical drive shaft has a diameter less than R, and having:
    a. a cylindrical lateral surface disposed about the driver axis DA, wherein the diameter of the cylindrical lateral surface is less than the diameter of the diameter D1 of the cylindrical interior chamber,
    b. a second sealing element extending circumferentially about the lateral surface of the driver element, and
      wherein the proximal end $P_D$ faces and is affixed to the distal end $D_E$ of electrostrictive element to a distal end $D_D$ opposite to proximal end $P_D$,
wherein the electrostrictive assembly, including the cylindrical cup element with the first sealing element disposed thereon, and the cylindrical disk portion of the driver element with the second sealing element disposed thereon, together with electrostrictive element, have dimensions, and respective resiliency coefficients of the sealing elements, so that the electrostrictive assembly between first sealing element and the second sealing element fits wholly within the cylindrical interior chamber during operation of the actuator, with the sealing elements permitting sliding expansion/contraction motion of the distal end $P_E$ of the electrostrictive element of the electrostrictive assembly with respect to the housing body in the direction of axis CDA, while hermetically sealing the cylindrical interior chamber between the first and second sealing elements with respect to points outside of that portion of cylindrical interior chamber.

8. A piezoelectric actuator according to claim 7, wherein the attachment assembly comprises:
a plurality of holes passing through the housing lid along and about associated lid attachment axes, and
a corresponding plurality of threaded boreholes extending into the housing body along and about associated bolt attachment axes, wherein the respective lid attachment axes and the bolt attachment axes are mutually aligned when the housing lid is interfit with the housing body with the lid axis LA aligned with the central displacement axis CDA.

9. A piezoelectric actuator according to claim 7, wherein the housing body is characterized by an outer shape having an outermost portion which is planar.

10. A piezoelectric actuator according to claim 9, wherein the outer shape is substantially a rectangular parallelpiped.

11. A piezoelectric actuator according to claim 7, further comprising electrical leads extending from the electrically conductive element on the opposite lateral surfaces of the electrostrictive element, wherein the leads penetrate through an associated one of two hermetically sealed apertures in the cup element to points outside of the housing, thereby establishing electrical terminals for receiving a drive signal for the actuator.

12. A piezoelectric actuator according to claim 7, further comprising an inlet/valve that providing a selectively operable pneumatic flow path between the cylindrical interior chamber and points external to the actuator.

13. A piezoelectric actuator according to claim 7, wherein:
the first sealing element is a first O-ring disposed in a groove extending into and circumferentially about the cylindrical outermost surface of the cap element, and
the second sealing element is a second O-ring disposed in a groove extending into and circumferentially about the cylindrical outermost surface of the drive element.

14. A piezoelectric actuator according to claim 7, wherein:
the first sealing element is a first wiper seal attached to and extending circumferentially about the cylindrical outermost surface of the cap element, and the second sealing element is a second wiper seal attached to and extending circumferentially about the cylindrical outermost surface of the drive element.

\* \* \* \* \*